Oct. 3, 1961 M. I. NYSTUEN 3,003,131

PRINTED CIRCUIT CONTACT AND MOUNTING ASSEMBLY

Filed Jan. 13, 1960

INVENTOR
MARCUS I. NYSTUEN

BY

Pennie, Edmonds, Morton, Barrows & Taylor
ATTORNEYS

United States Patent Office 3,003,131

Patented Oct. 3, 1961

3,003,131

PRINTED CIRCUIT CONTACT AND MOUNTING ASSEMBLY

Marcus I. Nystuen, St. Paul, Minn., assignor to Economics Laboratory, Inc., St. Paul, Minn., a corporation of Delaware Filed Jan. 13, 1960, Ser. No. 2,296

8 Claims. (Cl. 339—17)

This invention relates to means for mounting and simultaneously making electrical contact with printed circuit boards.

In accordance with the invention, the circuit board is supported by a plurality of aligned spring-mounted contact pins and a single mounting post spaced therefrom, so as to be readily inserted and removed and to assure continuance of reliable electrical connections when locked in position.

Considerable difficulty is caused in assemblies employing printed circuit boards, because of warpage of the boards during their use. One of the most serious effects of warpage is that it causes the portions of the board on which circuit terminals are located to move out of their normal plane thereby straining the board itself and causing external connections to break or, if the board is demountable, to cause the terminals to break their electrical connection with the contacts against which they are intended to bear. In fact, when several relatively widely spaced portions of the board remote from the circuit terminals are rigidly supported (as is usually the case), and localized warpage occurs in those portions, it often happens that the portions bearing the circuit terminals are displaced out of their normal plane even though these contact-carrying portions themselves are not actually warped. This occurs because the board is left supported at only certain points while others, such as those at the circuit terminals, are lifted off of their supports. If these supports involve electrical connections, the circuits are broken. These effects are even more critical when the printed circuit boards are used under extreme and variable conditions of temperature and humidity which produce especially severe warpage. Such conditions are especially prevelant in dishwashing machines and the like in which the present invention has been found to be very successful.

It is the principal object of this invention to overcome these disadvantages by providing a contacting and mounting assembly for a demountable printed circuit board which will relieve the board of stains and insure effective electrical connections with the external circuits notwithstanding the warpage which the board may undergo during its use. This is achieved by electrically contacting the circuit terminal portions or areas by means of a plurality of aligned spring-mounted contact pins and by supporting the board along only those aligned contact pins and at a single point spaced therefrom. Thus, in effect, the board is supported on a triangular mounting since it rests solely on a straight line formed by the resilient contact pins and on a single apex point spaced from the straight line. For this reason any contact point along such line will lie in the same plane with two other supporting points which together form a triangle, regardless of whether that contact point is displaced vertically with respect to the normal plane of the board.

This construction assures that the circuit board terminal areas remain in electrical connection with their respectively associated contact pins even though the board may warp severely. The contact pins have sufficient spring bias and extent of movement to prevent break of connection with the terminal areas regardless of warpage which may occur along the linear portion of the board supported by the pins. Thus, even if the printed circuit board mounted in this manner is used under extreme and variable temperature and humidity conditions and considerable warpage of the board results, the external circuits still remain connected. The invention also provides means not only for securing the printed circuit board on this novel triangular mounting, but for easily and quickly removing the entire board for servicing or replacement.

The printed circuit board employed in the assembly according to the invention comprises a rigid board of insulating material on which a plurality of aligned printed circuit terminal areas are formed. A frame is provided to support the board, and extending from the frame are a plurality of aligned spring-mounted contact pins which correspond in number and spacing to the terminal areas on the board which register therewith. A single mounting post also extends from the frame and is spaced from the contact pins. The board is adapted to be pivotally supported solely by this post and resiliently by the aligned spring contact pins with the terminals of the circuit in electrical engagement with the contact pins. For each pin a terminal screw is provided for making external connection. Fastening means are included for detachably retaining the board on the mounting post, and releasable clamping means are provided for forcing and locking the board against the contact pins.

A preferred embodiment of the invention is described below with reference to the accompanying drawing, wherein FIG. 1 is a fragmentary plan view, partly broken away, of the new printed circuit board contacting and mounting assembly;

Figure 1:
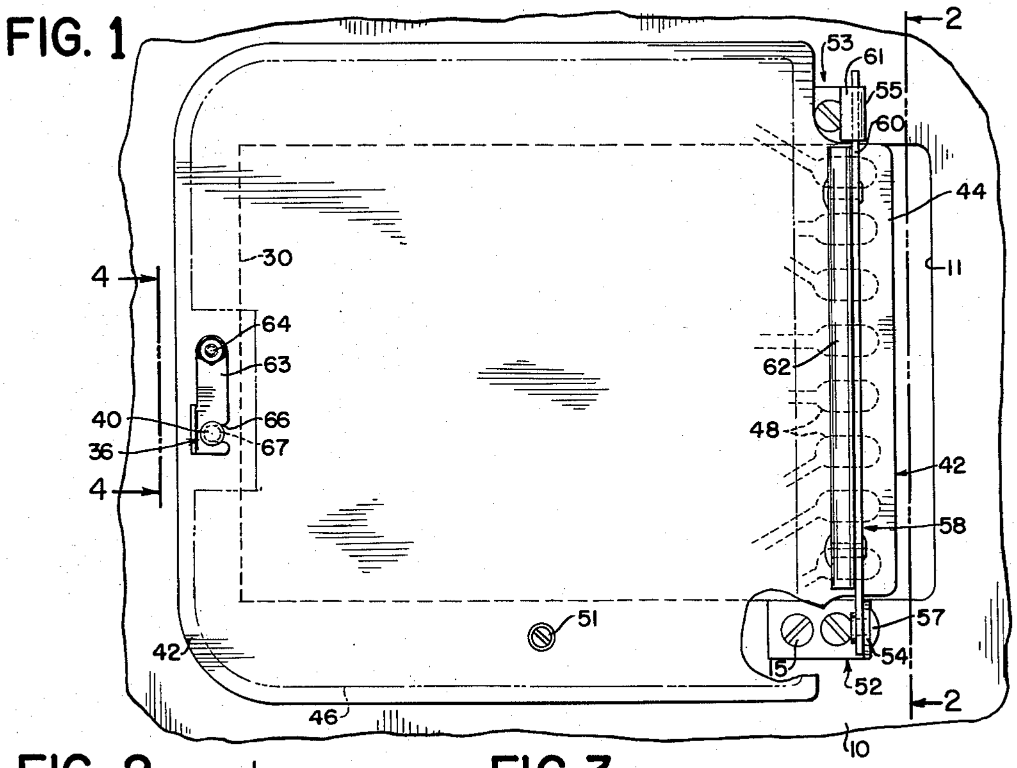

In the drawing a flat portion of a sheet-metal chassis or frame 10 is shown which may be part of the apparatus, such as a control system for a dishwashing machine, with which the circuit is to function. Formed in the frame 10 is a rectangular cutout 11. This cutout portion provides a space into which the underside of the circuit board can move, thus preventing short circuits by contact with the printed circuits thereon. A terminal block 13 of insulating material spans the cutout 11 adjacent one side thereof and is attached at its ends to the frame 10 by means of four screws 15. Two of the screws 15 at each end of the terminal block 13 extend through brackets 52, 53 and through holes in the frame 10 into threaded grommets 16 cemented in bores 17 in the block 13.

Figure 2:
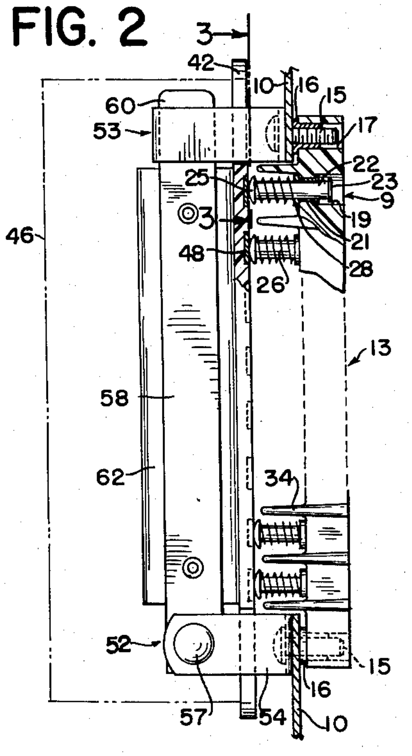
FIG. 2 is a sectional view taken along the line 2—2 of FIG. 1.

Throughout the length of the terminal block 13, between the edges of the cutout 11 of the frame, are a plurality of aligned holes 9 (FIG. 2). Each hole extends completely through the block 13 perpendicular to the plane of the frame 10, and is widened at the top by a counterbore 19. Fitted into the narrower portion of each hole 9 is a metal sleeve 21 in which a metal contact pin 22 is slidably disposed. In the embodiment here described, this pin has a movement or traverse of about ¼ inch. A flange 23 extends radially outwardly from the bottom end of each contact pin 22 projecting into the associated counterbore 19 so to stop that end of the pin from passing through that end of the sleeve 21. The opposite end of each contact pin 22 is formed with a head 25. Disposed about each contact pin between its head 25 and the adjacent end of the sleeve 21 is a helical compression spring 26. Each compression spring urges its contact pin 22 upwardly through the cutout 11 of the frame and electrically connects the pin to its associated metal connector strip 28.

Figure 3:
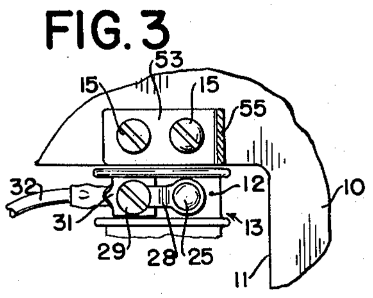
FIG. 3 is a sectional view taken along the line 3—3 of FIG. 2.

As shown in FIG. 3, this connector 28 is conductively attached to the top of each sleeve 21, is abutted by a spring 26, and extends over the insulating surface 12 to a terminal screw 29. Each terminal screw 29 is adapted to receive a detachable spade lug 31 on the end of an insulated conducting wire 32. Thus, current will pass from the insulated conductor 32 to the terminal screw 29 and thence through the spring 26 and sleeve 21 to the contact pin 22. In order to enhance the electrical insulation between the various spring-mounted contact pins and their terminal screws, a plurality of integral insulating barriers 34 extend from the terminal block 13 between the contact pins and terminal screws. If desired, a sheet of insulating material such as fiber may be placed over the row of terminal screws and secured at its ends under screws 15.

Figure 4:
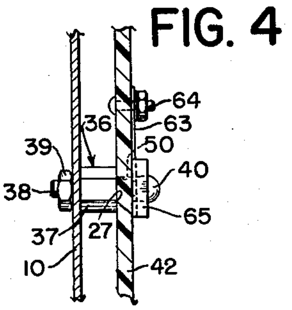
FIG. 4 is a sectional view taken along the line 4—4 of FIG. 1.

A post 36 on which the circuit board rests, extends perpendicularly from the frame 10 adjacent the edge of the cutout 11 opposite the row of contact pins 22, as shown in FIGS. 1 and 4. Post 36 has an hexagonal central portion 37 extending from the frame 10, and is attached thereto by a screw 38 which extends through the frame and is secured by a nut 39. The post terminates in a rounded head portion 40. As seen in FIG. 1, post 36 is so positioned as to comprise the apex of a triangle of which the line of contact pins 22 at the other side of the cutout forms the base. In the illustrated embodiment, the pin is offset from the exact center to accommodate a circuit component secured to the circuit board 42. It is not necessary that the pin be exactly in the center. The top of the hexagonal portion 37 of the post 36 comprises a shoulder 27 which is spaced from the top of the frame 10 a distance substantially equal to the spacing of the heads 25 of the contact pin from the top of the frame 10 when the board is locked in place. Hence, post 36 and the aligned head portions 25 of the contact pins 22 form what may be described as effectively a triangular mounting for printed circuit board 42. Shoulder 27 may be rounded off slightly to permit the board to tilt around the post as a pivot.

Board 42 comprises a substantially rigid laminate of glass-epoxy resin which is normally flat. Sheets of other insulating materials are sometimes used for the purpose. It is of generally rectangular shape, larger than the cutout 11, and has a relatively narrow projecting portion 44 extending along one side thereof. The length of the projecting portion 44, as measured along the side of the board 42, is slightly greater than the length of the row of contact pins 22. The broken line 46 in FIGS. 1 and 2 denotes the margin of conventional electrical components assumed to be mounted on the upper surface of board 42. The nature of these components, of course, will vary depending upon the electrical function to be performed by the apparatus. On the underside of the board 42 a network of electrical printed circuits is assumed to be embedded in or attached to the surface of the board. Each of these circuits which is intended for external connection ends at one of a plurality of circuit terminal areas 48 which are arranged in a line on the projecting portion 44 of the board 42. The centers of the terminal areas 48 are spaced apart at uniform distances substantially equal to the spacing between the centers of contact pins 22.

A small hole 50 extends through the board 42 at a position relative to the row of circuit terminal areas 48 which corresponds to the position of the mounting post 36 relative to the row of contact pins 22. The hole 50 is larger than the diameter of head 40 of the supporting post 36 to permit the board to tilt or pivot on the post. The completely separate self-contained unit comprising the board 42 and its attached electrical components may thus be positioned on the frame 10 by inserting the head 40 of the post 36 in the hole 50 and placing the terminal areas 48 of the circuit board along the respective contact pins 22. When this is done, the greater part of the network of printed circuits on the underside of the board overlies the cutout portion 11 of the frame 10, the respective terminal areas 48 are in electrical contact with the heads 25 of the various contact pins, and the board is supported solely by the row of resilient contact pins and by the pivot post around which it can rock or tilt.

Means are also provided for releasably locking the board 42 and its components to the frame 10. These include a pair of L-shaped brackets 52 and 53 attached to the frame 10 by four screws 15 which also hold the terminal block 13 in place, as previously mentioned. The brackets are disposed at opposite ends of the block 13, and include upright portions 54 and 55, respectively, between which the projection 44 of the board 42 is located. A clamp bar 58 is pivoted to the upright portion 54 of bracket 52 by means of a rivet 57. This bar, formed from a strip of metal, is adapted to swing edgewise in a plane perpendicular to the frame 10 and in alignment with the contact pins 22.

The free end 60 of the bar 58 clamps under the lip 61 on the upright portion 55 of bracket 53 when the bar is in its closed position. A heavy flat strip 62 of insulating material is riveted to clamp bar 58 and is adapted to press edgewise against the projecting portion 44 of the board 42, retaining the board substantially parallel to the top of the frame 10 when the end 60 of the clamp bar is held locked by the lip 61. Hence, when the clamp bar is closed against the circuit board 42, the insulating portion 62 forces the terminal areas 48 against the heads 25 of the contact pins 22 and the contact pins are thereby depressed about ⅛ inch against their respective springs 26. Thus, in its normal position, the board is held at about the center of the traverse of the pins. If desired, the clamp bar may be of one piece of insulating material, or in some cases entirely of metal.

The means for holding the board 42 on frame 10 also includes a latch 63 which is pivoted on a screw 64 adjacent the hole 50 in the board. The latch 63 may be swung over the surface of the board means of a finger tab 65. A U-shaped notch 66 in the end of the latch 63 is positioned to engage an annular groove 67 in the head 40 of the mounting post 36. Thus, when the board is in place over the post 36, latch 62 can be swung about its pivot so that the groove 67 is engaged in notch 66, thereby locking the board 42 on the post 36. The small amount of play provided between the head 40 of the post and the periphery of the hole 50 permits the board 42 to tilt or rock slightly around this head as a pivot to compensate for warping as below explained. The single supporting post may be resilient or tiltable if desired, but this is not necessary if the construction above described is employed. Stop pin 51 near one side of the cutout 11 extends upwardly from the frame 10 to prevent the board from moving appreciably closer to the frame than its normal operating position.

The board 42 and its attached electrical components as a unit may be very quickly mounted and simultaneously connected in the desired external circuits merely by placing the board with hole 50 about the head 40 of post 36, with the projecting portion 44 of the board between the upright portions 54 and 55 of the brackets 52 and 53 respectively, and then swinging clamp bar 58 against the board 42 and into its locked position under the lip 61 of the upright portion 55 of bracket 53. This causes all of the contact pins 22 to be depressed on their spring mountings as they make firm electrical contact with the corresponding terminal areas 48. Finally, the latch 63 is swung into the groove 67 in the head 40 of post 36, and the board is fully secured in operative position. The total pressure then exerted on the board by all of the springs 26 should be greater than the maximum weight of the board on the pins 22 in order to maintain proper pressure between terminal heads 25 and contact areas 48 and firmly support the board.

During operation of the apparatus it is possible that the board 42 may warp, particularly if it is used under conditions of variable temperature and humidity and if it carries components of different weights. Such warpage has virtually no deleterious effect on the board or on the electrical connections between the heads 25 of the contact pins and the respective circuit terminal areas 48 because the mentioned triangular support permits the board to tilt on post 36 as a ball-pivot, thus obviating strains in the board while retaining good contacts along the spring-pressed pins. Obviously any displacement along the line of the contact pins 22 is compensated for by the resilient movement of the affected pins.

I claim:

1. A printed circuit board contacting and mounting assembly comprising a board of insulating material, a plurality of aligned circuit terminal areas along one edge thereof, a frame adapted to support said board, a plurality of aligned resilient contacts extending from said frame corresponding substantially in number and spacing to said areas, a supporting pivot post extending from said frame and spaced from said contacts to form a triangle therewith, said board being adapted near one edge to be pivotally supported solely on said post and resiliently supported solely on said contacts near the opposite edge thereof with said terminal areas in electrical engagement with said contacts, latching means for detachably holding said board pivotally on said mounting post, and releasable clamping means over said contacts for pressing said board against and resiliently retaining it on said contacts.

2. A printed circuit board contacting and mounting assembly comprising a board of insulating material, a plurality of aligned circuit terminal areas thereon, a frame adapted to support said board, a plurality of spring-mounted contact pins extending from said frame corresponding substantially in number and spacing to said areas, a single supporting pivot post extending from said frame at a point substantially spaced from and opposite approximately the center of the aligned contact pins, said board being adapted to be pivotally supported on said post near one edge thereof and resiliently supported along the opposite edge by said contact pins with said terminal areas in electrical connection with said pins, latching means cooperating with said post for detachably and pivotally holding said board on said post, and releasable clamping means for pressing said board against and resiliently retaining it on said contact pins.

3. A printed circuit board contacting and mounting assembly comprising a normally flat rigid board of insulating material subject to warping, said board having thereon a plurality of printed circuit terminal areas along one edge portion thereof, a frame adapted to support said board, a plurality of aligned contacts corresponding in number and spacing to said areas and being resiliently mounted on and extending from said frame, a single pivot post extending from said frame at a point spaced from and opposite approximately the center of the aligned contacts, said board being proportioned and adapted to be pivotally supported at one edge portion solely by said post and supported along the opposite edge portion resiliently and solely by said contacts with said terminal areas in electrical and mechanical engagement with said contacts, latching means for detachably pivotally holding said board on said post at a fixed distance from said frame, a clamp bar pivotally mounted at one end on said frame and adapted to be pressed against said board only along a linear portion thereof over said terminal areas, and locking means on said frame adapted to hold the free end of said clamp bar so as to force said terminals against said contacts irrespective of said warping.

4. A printed circuit board contacting and mounting assembly comprising a normally flat substantially rigid board of insulating material, said board having a plurality of printed circuit terminal areas in line along one edge portion thereof, and a hole through the edge portion of said board at a point spaced from and substantially opposite the center of said line of terminal areas, a frame adapted to support said board, a plurality of aligned contact pins corresponding in number and spacing to said areas, said pins being insulated from each other and spring-mounted on and movable perpendicularly to said frame, a pivot post having a shoulder and an extended end portion adapted to be received loosely in said hole, said post extending from said frame at a position relative to the line of said contact pins which corresponds to the position of said hole relative to the line of said terminal areas, whereby said board is pivotally supported solely on said shoulder and on said contact pins when said terminal areas are in electrical engagement with said contact pins, and means for retaining said board on said frame comprising a latch pivotally mounted on said board adjacent said hole and adapted to engage said end portion of said post when extending through said hole so as to pivotally retain said board on said post, a clamp bar hinged at one end on said frame and adapted to be pressed against the surface of said board behind said terminals, and locking means on said frame adapted to lock the free end of said clamp bar in position to force said terminals against said contact pins so as to move the same against their spring mounts.

5. A printed circuit board contacting and mounting assembly comprising a normally flat, substantially rigid, rectangular board of insulating material subject to warping, said board having a plurality of printed circuit terminal areas in line along one edge portion thereof, and a mounting hole through said board substantially centrally located near the edge portion thereof opposite said areas, a frame adapted to support said board, a plurality of aligned contact pins corresponding in number and spacing to said areas, a block of insulating material secured to said frame, said pins being slidable in holes in said block, springs disposed to urge said pins upwardly above the surface of said frame, a post having a shoulder and an extended end portion slightly smaller than said hole and adapted to be received in said mounting hole, said post extending from said frame at a position relative to the line of said contact pins which corresponds to the position of said mounting hole relative to the line of said terminal areas, whereby said board is supported solely on said shoulder and on said contact pins when said terminal areas are in electrical engagement with said contact pins, said frame being formed with a cutout portion generally corresponding in shape to, but smaller than and underlying said board when the board is mounted on said frame, and means for retaining said board on said frame comprising a latch pivotally mounted on said board adjacent said mounting hole and adapted to swing into engagement with said end portion of said post when extending through said mounting hole, a clamp bar pivotally mounted at one end on said frame and having an insulating strip adapted to be swung against said board along a linear portion thereof behind said terminal areas, and locking means on said frame adapted to lock the free end of said clamp bar in fixed position to force said terminal areas against said contact pins and move said pins against their springs.

6. An assembly for mounting and making external connections with a printed circuit board having printed circuits on the underside thereof, comprising a frame having a cutout portion on one face thereof, a block of insulating material secured to the frame and extending across one side of and within the cutout portion, a row of contact pins disposed to slide in holes in said block, springs urging said pins out of said holes and above the surface of said frame, stop means preventing said pins from leaving said holes, terminal means connected to said pins and adapted to be connected to extend circuit means, a pivot post upstanding from said frame near the center of the side of said cutout portion opposite said row of pins, said post having shoulder means adapted to comprise a pivotal support for a circuit board at one side thereof, and clamp means securable to said frame so as to extend along and above the line of said pins when clamped in position on the upper side of a circuit board to force the underside of the board onto said pins whereby said board is pivotally supported solely by said post and by said row of spring-pressed pins opposite said post, while said pins also make electrical contact with such parts of the printed circuits on the underside thereof as register with said pins.

7. An assembly according to claim 6 in which the total force exerted by said springs on said board exceeds the weight of the board.

8. An assembly for mounting and contacting a circuit board of the type having circuit connections on the under side thereof and circuit components secured on the upper side thereof, said board being subject to warping, said assembly comprising a chassis frame having an upper surface, a row of resilient contact members insulated from each other and upstanding from said surface so as to connect with a corresponding row of conductive areas on the under side of said board, said contact members having substantial movement perpendicular to said surface and being adapted to comprise a linear resilient support along one edge of said board, a circuit-board-supporting pivot post secured to said frame upstanding from said surface and spaced from said row of contacts at a position opposite approximately the center of said row so as to form the apex of a triangle of which said row is the base, means on said post for pivotally supporting said board at a fixed distance above said surface, clamping means secured to said frame for urging a circuit board toward said surface and retaining it at a normal position substantially parallel to said surface, thereby pressing said conducting areas against said contacts such as to retain the contacts in an intermediate position of their movement, and means for latching said circuit board in tiltable relation to said post and to the surface of said frame so as to assure continuous contacts and the integrity of said board irrespective of warping.

References Cited in the file of this patent

UNITED STATES PATENTS

| | | |
|---|---|---|
| 2,286,812 | Keefe | June 16, 1942 |
| 2,941,053 | Braunstein et al. | June 14, 1960 |

FOREIGN PATENTS

| | | |
|---|---|---|
| 928,119 | France | May 26, 1947 |